United States Patent [19]

Tsao

[11] Patent Number: 4,540,607
[45] Date of Patent: Sep. 10, 1985

[54] SELECTIVE LPCVD TUNGSTEN DEPOSITION BY THE SILICON REDUCTION METHOD

[75] Inventor: Kuey-Yeou Tsao, Barrington, Ill.

[73] Assignee: Gould, Inc., Rolling Meadows, Ill.

[21] Appl. No.: 521,500

[22] Filed: Aug. 8, 1983

[51] Int. Cl.$^3$ .................. B05D 3/06; C23C 11/00; C23C 13/00
[52] U.S. Cl. .................. 427/253; 427/38; 427/39; 427/404
[58] Field of Search .................. 427/34, 253, 38, 39, 427/404

[56] References Cited

U.S. PATENT DOCUMENTS

| | | | |
|---|---|---|---|
| 3,061,463 | 10/1962 | Samuel | 117/107 |
| 3,543,386 | 12/1970 | Inoue et al. | 29/473.1 |
| 3,697,343 | 10/1972 | Cuomo et al. | 156/13 |
| 3,784,369 | 1/1974 | Svanstrom | 75/0.5 BB |
| 3,911,194 | 10/1975 | Dejachy et al. | 428/408 |
| 4,198,449 | 4/1980 | Freller et al. | 427/255.3 |
| 4,362,564 | 12/1982 | Danko | 75/222 |
| 4,364,969 | 12/1982 | Dearnaley et al. | 427/383.9 X |
| 4,402,771 | 9/1983 | Thomas | 427/253 X |
| 4,422,897 | 12/1983 | Horwitz | 427/38 X |

OTHER PUBLICATIONS

Morosanu et al., "Kinetics and Properties of Chemically Vapour-Deposited Tungsten Films on Silicon Substrates," *Thin Solid Films*, 52, (1978), 181–194.

Miller et al., "Hot-Wall CVD Tungsten for VLSI," *Solid State Technology*, 79–82, (1980).

Broadbent et al., "Selective Low Presssure Chemical Vapor Deposition of Tungsten, " *Extended Abstracts*, The Electrochemical Society Spring Meeting, San Francisco, CA, Abstract 420, (1983).

Gargini, "Tungsten Barrier Eliminates VLSI Circuit Shorts," *Industrial Research & Development*, 141–147, (1983).

*Primary Examiner*—Michael R. Lusignan
*Attorney, Agent, or Firm*—G. P. Edgell; Edward E. Sachs

[57] ABSTRACT

A method is described for treating the surface of a field-effect transistor or a Schottky barrier diode. A polysilicon surface of a gate region of an FET or a single crystalline silicon surface of a Schottky barrier diode may be treated with a low-power argon-plasma for a relatively short period of time to enhance nucleation sites on the surface of the polysilicon or single crystalline silicon. A layer of tungsten or molybdenum may be selectively deposited on the surface of the polysilicon or single crystalline silicon by chemical-vapor deposition through silicon reduction of tungsten hexafluoride or molybdenum hexafluoride.

9 Claims, 10 Drawing Figures

SELECTIVE LPCVD TUNGSTEN DEPOSITION BY THE SILICON REDUCTION METHOD

BACKGROUND OF THE INVENTION

This invention relates generally to surface treatment methods for single crystalline and polycrystalline silicon surfaces and more specifically to argon-plasma treatments and chemical-vapor deposition methods for such surfaces in semiconductor devices.

Field-effect transistors may be provided with a polysilicon gate region having a layer of metal placed thereon to lower the sheet resistance of the polysilicon gate region from 20 ohms per square to as little as 2 ohms per square to improve the speed of the gate region. This layer of metal acts as a shunt to produce an increase in circuit speed. In other applications, it is desired to place a thin layer of refractory metal on a single crystalline surface of a silicon diode to form either a Schottky-barrier diode or an ohmic contact, depending on the type and doping concentration of the semiconductor.

In the past, molybdenum and tungsten have been investigated for use as self-aligned refractory metal gates in large-scale integrated-circuit (LSI) technology. More recent developmental efforts in LSI have produced an increasing interest in polysilicon gates and a corresponding declining interest in refractory metal gates. However, in very-large-scale integrated-circuit (VLSI) technology, doped polysilicon which is typically used as the gate material has a sheet resistance of 20–50 ohms per square for a 0.5 micron thick film; even with a 10 ohms per square film, the RC time delay of fine polysilicon lines outweighs the speed advantages gained from short channel transistors. (RC time delay is a delay in the circuitry due to the resistance and capacitance in the circuit.) Therefore, as line widths in VLSI circuits shrink, the major speed limitations arise from the RC time constant associated with silicon gates and polysilicon interconnect lines and not from transient time between source and drain of a field-effect transistor. To reduce interconnect resistivity, it is desirable to deposit refractory metals or metal silicides on top of the polysilicon lines.

Refractory metals for VLSI applications are customarily deposited by three different methods: sputtering, evaporation, and chemical-vapor deposition. Each approach has advantages and disadvantages. The main advantage of the sputtering process is that it is possible to sputter almost any material. Both pure refractory metals and refractory metal silicides can be sputtered. However, sputtering machines are complicated and require considerable maintenance. Also, elaborate etching techniques have to be employed to obtain discontinuity-free etching profiles of a silicide/polysilicon composite.

Evaporation of refractory metals has been investigated as a means for forming VLSI. However, evaporation has many of the deficiencies associated with sputtering. For example coverage is poor and the deposition process is complex using evaporation techniques.

Chemical-vapor deposition (CVD) and low-pressure chemical-vapor deposition (LPCVD) of refractory metals offer several advantages over sputtering and evaporation techniques. CVD of refractory metals can provide good coverage, reduced system complexity, and higher purity deposits. In addition, CVD is an attractive alternative to the above methods because it does not need an additional photolithography step when the chemical-vapor deposition process is a selective process in which the refractory metal is deposited only on the polysilicon gate area and not on surrounding silicon-dioxide areas.

Tungsten films have been formed in the past by hydrogen reduction of tungsten hexafluoride according to the equation $$3H_2 + WF_6 \rightarrow W + 6HF. \qquad (1)$$

This reaction has been discussed in great detail in Morosanu, C-E. and Soltuz, V, "Kinetics and Properties of Chemically Vapour-Deposited Tungsten Films on Silicon Substrates" *Thin Solid Films,* 52(1978) 181–194. This article is incorporated herein by reference. As can be seen from equation (1), hydrofluoric acid is a byproduct of the hydrogen reduction of tungsten hexafluoride. This is an undesirable byproduct because HF etches any silicon oxide typically surrounding the gate region. Also, the thickness of the film produced by this method is difficult to reproduce accurately even under identical deposition conditions. Also, under certain flow-rate conditions, tungsten will deposit on silicon dioxide or other surrounding materials. Thus, the deposition process is not a totally selective deposition process. This is true particularly in instances in which it is desired to produce a film of tungsten having a thickness greater than 2,000 angstroms.

SUMMARY

A method is described for treating the surface of a field-effect transistor or a diode. A polysilicon surface on the gate region of an FET or single crystalline silicon surface of a diode may be treated with a low-power plasma such as argon, or other inert gases or nitrogen or oxygen, for a relatively short period of time to enhance nucleation sites on the surface of polysilicon or single crystalline silicon. In addition a method is described to form thin layers of tungsten on the treated surfaces by silicon reduction of tungsten up to 1,000 angstroms thick hexafluoride via low-pressure chemical-vapor deposition.

DETAILED DESCRIPTION

Figure 1:
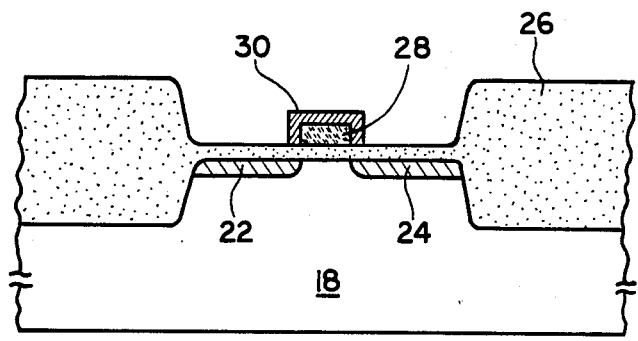
FIGS. 1, 2, and 3 illustrate different embodiments of a field-effect transistor having a thin layer of tungsten deposited upon a polysilicon gate area.

It is important to recognize that the argon-plasma surface treatment method and the silicon reduction method described in this application may be used in a variety of configurations for semiconductor devices. For example, FIG. 1 illustrates a field-effect transistor having a p-type silicon 18 substrate and n-doped source and drain regions 22 and 24. A layer of silicon dioxide 26 covers the substrate and source and drain regions. Polysilicon 28 is placed between the source and drain regions above the layer of silicon dioxide 26. In the embodiment illustrated in FIG. 1, the polysilicon region 28 extends above the silicon dioxide region 26. A layer of tungsten 30 is provided to cover the polysilicon area 28 both vertically and horizontally. A desirable feature of chemical-vapor deposition for forming the layer of tungsten is that since the layer is formed through a chemical reaction, almost any geometric configuration can be uniformly coated.

Figure 2:
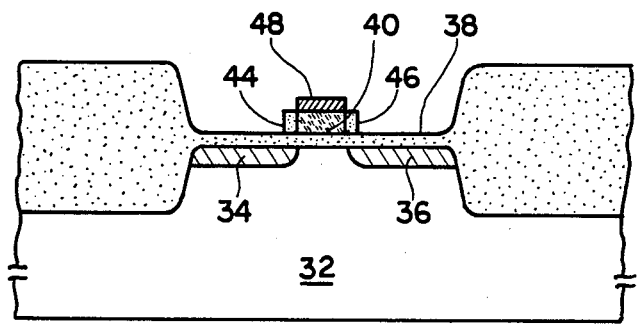

Referring now to FIG. 2 in which a p-type silicon substrate 32 is provided with source 34 and drain 36 regions of n-type silicon having a layer of silicon dioxide 38 thereupon. A polysilicon gate 40 is provided which extends above the layer of silicon dioxide. In this embodiment however, silicon dioxide walls 44, 46 surround the upwardly extending polysilicon. Thus, it is only necessary to provide an upper-surface coating 48 of tungsten on the polysilicon 40 to produce the desired sheet metal resistance. The structure illustrated in FIG. 2 reduces possible short-circuits that can form in the structure of FIG. 1 between tungsten 30 and regions 22, 24 respectively through pinholes in the oxide layer 26.

Figure 3:
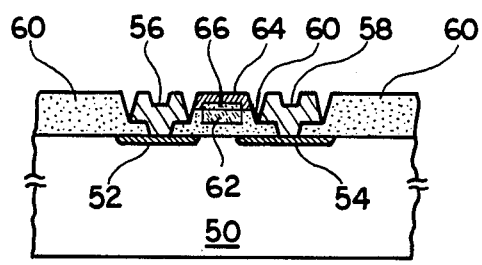

In yet another embodiment illustrated in FIG. 3, a silicon substrate 50 is provided with n-type source and drain regions 52 and 54. Aluminum contacts 56, 58 may be provided over the source and drain regions. A layer of silicon dixide 60 may be provided to protect the surface of the silicon substrate. A polysilicon gate 62 is provided betwen the source and drain regions. A layer of tungsten 64 is provided over the polysilicon gate to reduce the sheet resistance of the gate region. The gate region is then covered with silicon dioxide 66 as illustrated in FIG. 3. FIG. 3 is similar to FIGS. 1 and 2, FIG. 3 simply illustrates the completed semiconductor product.

Figure 4:
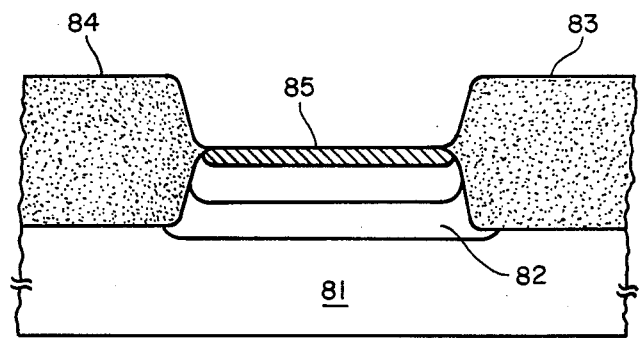
FIGS. 4 and 5 illustrate diode configurations having a layer of tungsten deposited on a single crystalline surface.

FIG. 4 is an illustration of an ohmic contact. A p- or n-type single crystalline silicon substrate 81 is provided with an oppositely doped region 82. An oxide formation 83, 84 typically called a "bird's beak" formation due to its configuration is formed on the upper surface of the substrate. Tungsten is deposited using the silicon reduction method in region 85 to form the ohmic, or low-resistance, contact. It is interesting to note that when tungsten is deposited according to the silicon reduction method described herein, that the layer of tungsten is actually formed beneath the "beak" of the oxide layers. This phenomenon occurs because silicon is actually consumed in the chemical-vapor deposition process.

Figure 5:
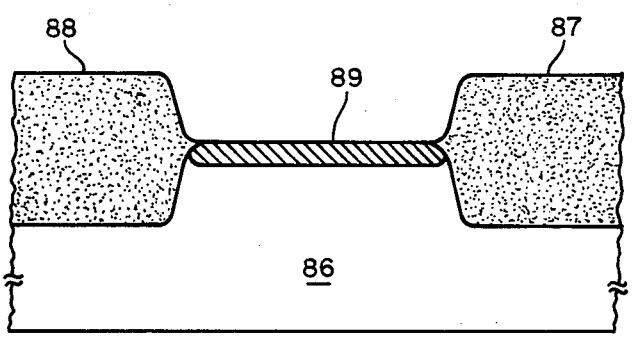

FIG. 5 is an illustration of still yet another embodiment of the subject development in which a Schottky-diode is provided with a plasma surface treatment and a layer of tungsten according to the silicon-vapor deposition method. In this embodiment, a single crystalline substrate 86 is provided with a layer of silicon dioxide 87, 88 with an opening 89 to the substrate 86 therebetween. The opening is treated with a low-power plasma such as argon to create more active nucleation sites. Tungsten 89 is then deposited according to equation (2) by CVD.

The subject invention comprehends that a plasma surface treatment method can be used to prepare the silicon and polysilicon surfaces described in the previous figures for chemical-vapor deposition. In this method, a low-power plasma such as argon, or other inert gas, or nitrogen or oxygen is used which does not destroy the integrity of the surrounding configuration. The low power plasma surface-treatment method serves to enhance the nucleation sites on the surface of the silicon or polysilicon to provide increased available bonds for deposition.

Some important features of the silicon reduction method of chemical-vapor deposition of tungsten as described herein include that a harmless byproduct is produced when tungsten is selectively deposited on a silicon surface according to the equation

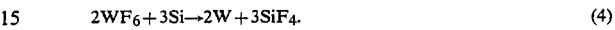

$$2WF_6 + 3Si \rightarrow 2W + 3SiF_4. \quad (4)$$

As can be seen from equation (2), the byproduct of this reaction is $SiF_4$ which is generally nonreactive with regard to semiconductor materials. This is quite different from the byproduct produced by the reaction described in equation (1) in which hydrofluoric acid is produced. Hydrofluoric acid detrimentally reacts with the surrounding semiconductor materials in a deleterious fashion.

Another important feature of the use of the silicon reduction method for depositing tungsten as described herein is that silicon is consumed in the reaction process. This requires silicon to be available in order for the deposition of tungsten to occur. This causes the reaction to be a self-limiting reaction. Also, the fact that silicon is required for the deposition process to occur means that the chemical-vapor deposition process according to reaction (2) is a 100% selective deposition process when used in the configuration in FIGS. 1–5 or any other similar semiconductor configuration.

Yet another feature of the selective deposition process when used in conjunction with the argon-plasma surface treatment method described herein is that relatively thick films of tungsten may be deposited due to increased bonds available at the nucleation sites. Thus, reduced sheet resistance may be achieved over techniques in which tungsten is deposited on polysilicon or single crystalline silicon surfaces that have not been previously treated with an argon-plasma. Experimental results indicate that the argon-plasma surface treatment method also tends to enhance the reproducibility of the chemical-vapor deposition process when the process is repeated in a similar manner. Reproducibility problems have existed in the past with other methods of depositing tungsten on single crystalline or polycrystalline silicon surfaces.

The following detailed description is an example of the subject development. A sample of silicon is prepared by cleaning the silicon sample with a solution of $NH_4OH + H_2O_2 + H_2O$ in the ratio of 1:1:7 for ten minutes. The wafer is subsequently cleaned with $H_2SO_4 + H_2O_2$ in a ratio of 3:1 for 10 minutes. This process removes organic and metallic impurities from the silicon surface.

After the sample has been cleaned according to the method described above or some other comparable method, the sample is then oxidized in an atmosphere of $O_2$ at a temperature of 1050° C. for approximately 80 minutes to allow a layer of silicon dioxide to form. In most applications the oxide thickness which is formed is approximately 1,000 angstroms.

After the oxidation step is performed, then it is desired to deposit a layer of polysilicon on the silicon dioxide surface of the sample. This is commonly done by silane decomposition at 600° C. to produce a layer of approximately 5,000 angstroms on top of the silicon dioxide layer of the sample. Once again, the polysilicon deposition step may be performed by any other comparable method.

After the polysilicon layer has been deposited, it is frequently desired to dope the polysilicon to be an n-type material. One method of doping polysilicon is to expose it to $PH_3$ at 950° C. for approximately 50 minutes.

After the polysilicon has been doped, the next step is to shape the polysilicon regions by a photo-resist/plasma-etch technique in which photo resist is placed on the areas of polysilicon that are desired to be maintained and then expose the remaining polysilicon to a plasma-etch such as $CF_4 + 4\% O_2$.

The subject invention comprehends that before tungsten is applied to polysilicon surface, the sample is exposed to a low-power argon-plasma to treat the surfaces of the polysilicon elements. The argon-plasma may be maintained in a power range from 2 W to 5 W. The argon-plasma surface treatment method may be performed in a barrel reactor with an initial chamber temperature of 80° C. In one experiment, a barrel reactor such as the type manufactured by LFE was used to perform the argon-plasma surface treatment method as described herein. In one example, the low-power argon-plasma surface treatment method was performed for approximately 5 minutes. The subject invention, however, comprehends that the argon-plasma surface treatment may last from 2 to 30 minutes. The subject invention also comprehends that the power range of the plasma in the surface treatment method may vary from 2 W to 50 W. In the currently preferred embodiment, however, the power range is on the order of 2 W and the treatment time is on the order of $2\frac{1}{2}$ minutes. It should be noted that the initial temperature of the chamber is not critical and may vary widely depending on other applications. Also, other types of plasma reactors may be used such as a flat plate reactor.

Figure 6:
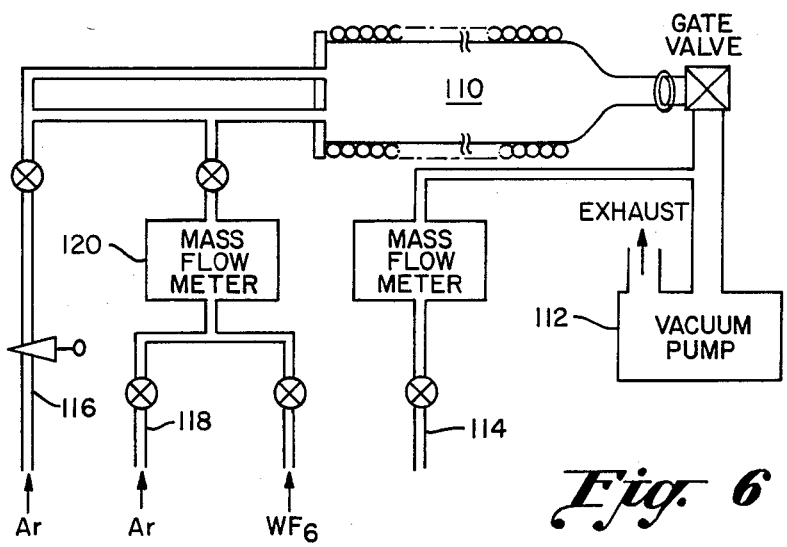
FIG. 6 is a schematic diagram of a system for chemical-vapor deposition of tungsten onto a polysilicon or single crystalline silicon surface.

After the sample has been subjected to the argon-plasma surface treatment method described above, the sample may be placed in a chemical-vapor deposition chamber 110 as illustrated in FIG. 6. The chamber is then evacuated by vacuum pump 112 to clear any oxygen in the chamber 110. Nitrogen is provided through line 114 to assist in the evacuation of oxygen from the chamber 110. After the chamber has been sufficiently evacuated, line 116 is opened to allow argon to flow into the chamber until a pressure of 0.3 to 3 torr is attained. The presence of argon serves as a carrier gas to provide a more uniform deposition of tungsten. Other inert gases may be used such as nitrogen or helium. After sufficient argon pressure is attained, line 118 is opened to purge mass-flow meter 120 and line 122 leading to chamber 110. It is important to note that the chamber is heated by elements surrounding the chamber indicated by 124 in the figure. The chamber is heated to a temperature of approximately 300° C. to 500° C. Tungsten hexafluoride is then allowed to flow through line 126 through mass-flow meter 120 and into chamber 110 for approximately 5 to 30 minutes. As can be seen from FIG. 8, several experiments have been performed using varying mass-flow rates of tungsten hexafluoride. As can be seen from the figure, it is probably desirable to use a mass-flow rate in the range of 10 to 40 cc per minute when the deposition time is 3 minutes and the deposition temperature is 410° C. It is important to note in the graph in FIG. 8 that the upper line 128 indicates the sheet resistance for samples which were not treated with the argon-plasma surface treatment method described herein. On the other hand, the lower line 130 illustrates the effect of the argon-plasma surface treatment method on the sheet resistance of samples using the same silicon reduction chemical-vapor deposition method to reduce the sheet resistance of the polysilicon area. It is readily apparent that the argon-plasma surface treatment method provides a substantial decrease in sheet resistance given the same mass-flow rate and deposition time and deposition temperature. All of the samples in the lower line 130 were treated with an argon-plasma at a power setting of 2 W for 5 minutes.

Figure 9:
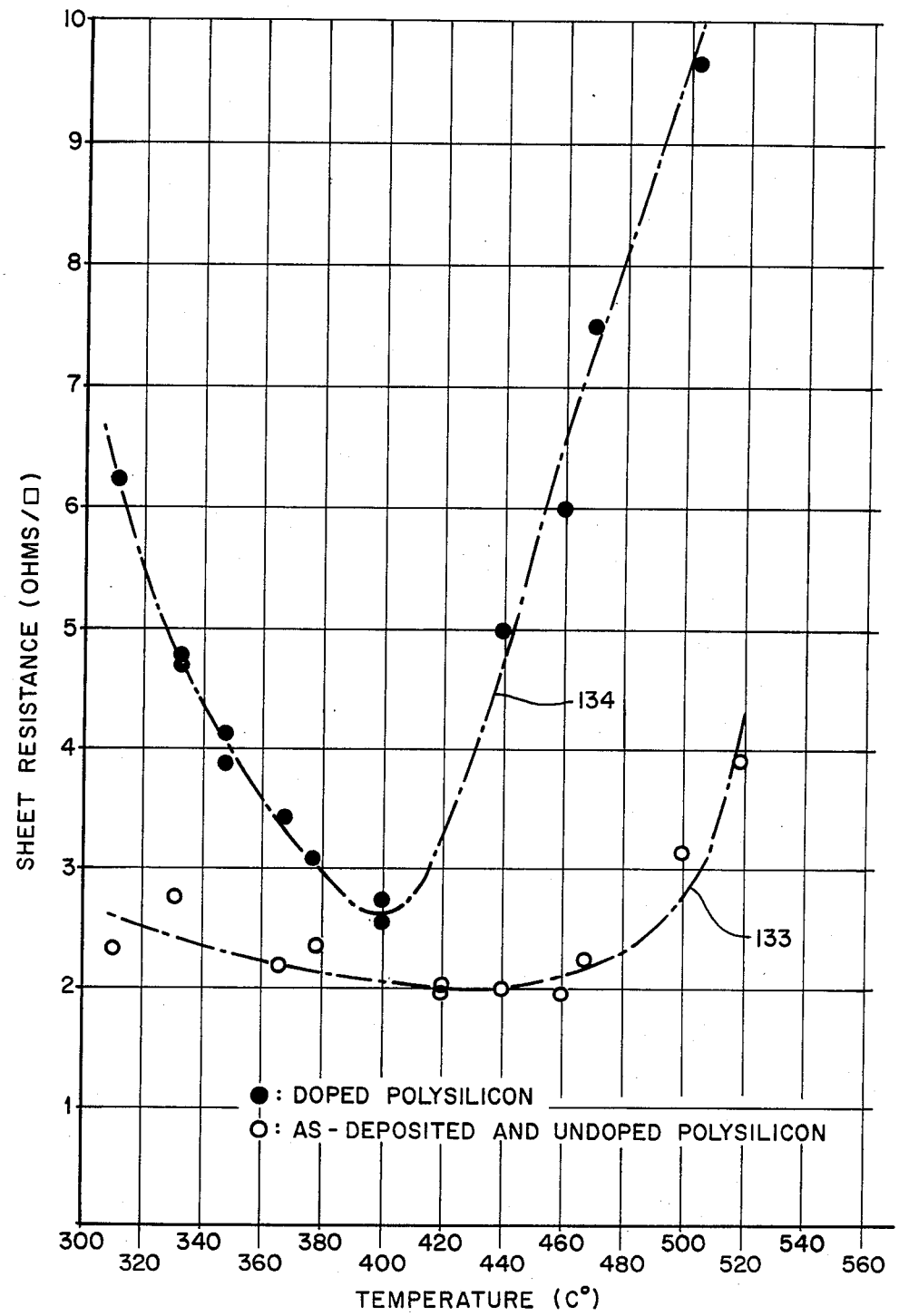
FIG. 9 is a graph illustrating the sheet resistance of various samples versus temperature.

Refer now to FIG. 9, line 133 illustrates the sheet resistance of undoped polysilicon with respect to different deposition temperatures. Line 134, on the other hand, illustrates the sheet resistance of doped polysilicon with respect to various deposition temperatures. As can be seen from the figure, the sheet resistance for both doped and undoped polysilicon generally decreases with temperature up to approximately 420° C. for undoped polysilicon. In view of the results illustrated in FIG. 9, the preferred deposition temperature range for doped polysilicon is between 320° C. and 440° C.

Figure 10:
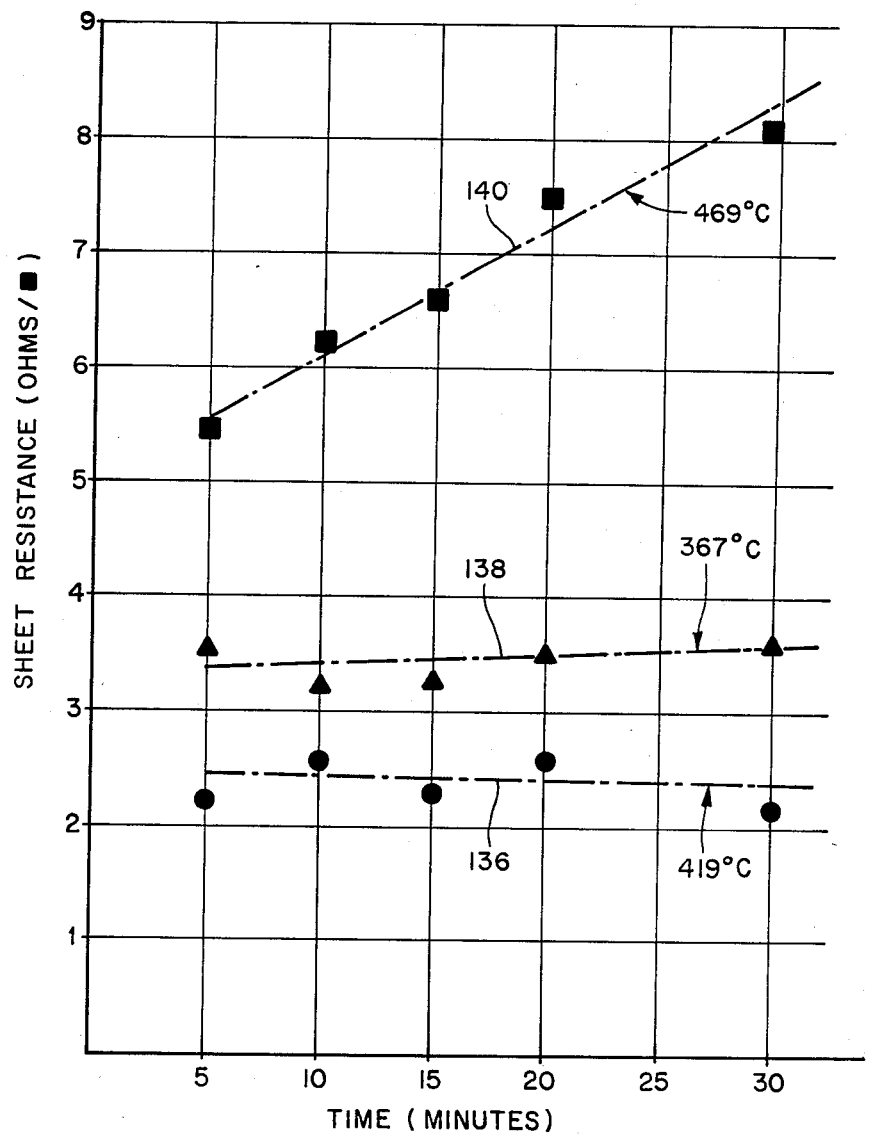
FIG. 10 is a graph illustrating the sheet resistance of various samples versus deposition time.

Referring now to FIG. 10, one can see that increased deposition times tend to produce decreased amounts of tungsten depositions as indicated by the sheet resistance for various samples illustrated by generally linear results 136, 138 and 140. Thus, it is apparent that the tungsten deposition method in which silicon is consumed during the deposition process as described herein is a self-limiting process.

Figure 7:
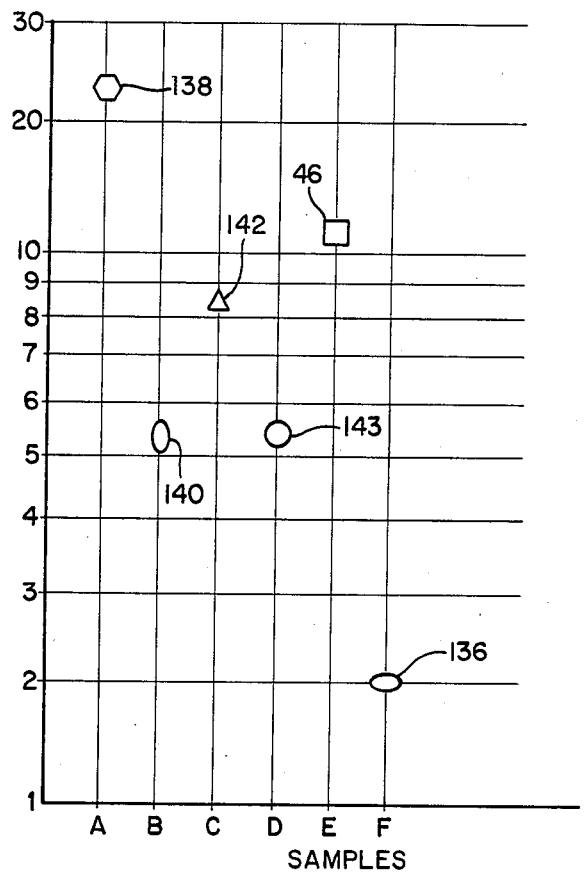
FIG. 7 is a logarithmic graph indicating the sheet resistance of various samples.
Figure 8:
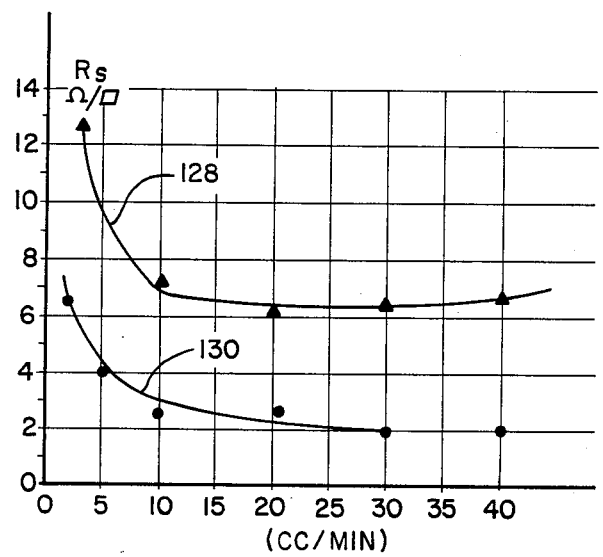
FIG. 8 is a graph illustrating the sheet resistance of various samples versus flow rate.

The graph illustrated in FIG. 7 is similar in respect to the results illustrated in FIG. 8. In the graph in FIG. 7, the sheet resistance of various samples were tested when the samples were exposed to tungsten deposition according to the chemical-vapor deposition silicon reduction method described herein. FIG. 7 is similar to FIG. 8 in that sample 136 had the lowest sheet resistance of all the samples illustrated in FIG. 7. Sample 136 was the only sample which had an argon-plasma surface treatment prior to chemical-vapor deposition. Samples 138 and 140 were polysilicon samples having a phosphorous ion implant. Sample 142 was a phosphorous-doped sample of polysilicon. Sample 143 was an undoped sample of polysilicon, and sample 146 was a sample of "p" type silicon which had been n+ doped. Sample 136 was an n+ doped polysilicon sample which, as previously noted, had been treated with argon-plasma.

It is important to note that, while the above example has been directed to tungsten vapor deposition, molybdenum may also be deposited in a manner generally similar to the manner described above for tungsten. The reaction for molybdenum-vapor deposition is as follows:

$$2MoF_6 + 3Si2Mo + 3SiF_4 \qquad (3)$$

Experiments have not been performed for chemical-vapor deposition of molybdenum using the above reaction. However, it is apparent hat the results would be similar to the results obtained for tungsten. This is true because $MoF_6$ has been used in hydrogen reduction methods similar to previously used hydrogen reduction methods of $WF_6$. The chemical properties of $MoF_6$ are quite similar to $WF_6$. It is also comprehended to be within the scope of this invention that other refractory metals or other metals in general may be deposited on silicon by silicon reduction chemical-vapor deposition.

Although the invention has been described and illustrated in detail, it is to be clearly understood that the same is by way of illustration and example only, and is not to be taken by way of limitation; the spirit and scope of this invention being limited only by the terms of the appended claims.

I claim:

1. A method of treating polycrystalline and single crystalline silicon surfaces having nucleation sites thereon, comprising the step of:
    preparing said surface by exposing said surface to an inert plasma to induce more uniform nucleation sites on said surface.

2. A method of preparing surfaces as recited in claim 1, wherein said polysilicon surface is exposed to an argon-plasma for two to thirty minutes.

3. A method of treating said surfaces as recited in claim 1, wherein said plasma is an argon plasma in a power range of 2 W to 50 W.

4. A method of treating surfaces as recited in claim 1, further comprising the step of:
    selectively depositing up to 1,000 angstroms of tungsten by chemical-vapor deposition on said surface according to the reaction $$2WF_6 + 3Si \rightarrow 2W + 3SiF_4$$

wherein a thin layer of said surface is consumed during deposition to produce $SiF_4$ and tungsten remains on said surface, said depositing step being performed after said preparing step.

5. A method of treating surfaces as recited in claim 4, wherein said chemical-vapor deposition lasts from two minutes to thirty minutes.

6. A method of treating surfaces as recited in claim 4, wherein said temperature of said surface during said deposition step is in the range of 300° C.–550° C.

7. A method of treating surfaces as recited in claim 4, wherein the thickness of tungsten deposited on said surface during said depositing step is up to 1000 angstroms thick.

8. A method of treating surfaces as recited in claim 4, wherein said depositing step is performed in an argon atmosphere.

9. A method of treating surfaces as recited in claim 1, further comprising the step of:
    selectively depositing molybdenum by chemical-vapor deposition on said surfaces according to the following reaction $$2MoF_6 + 3Si \rightarrow 2Mo + 3SiF_4 \uparrow$$

wherein a thin layer of said surface is consumed during said chemical-vapor deposition step, said depositing step being performed after said preparing step.

* * * * *